US009803712B2

(12) United States Patent
Jantunen

(10) Patent No.: US 9,803,712 B2
(45) Date of Patent: Oct. 31, 2017

(54) BRAKE MONITORING

(71) Applicant: KONECRANES GLOBAL CORPORATION, Hyvinkää (FI)

(72) Inventor: Aapo Jantunen, Hyvinkää (FI)

(73) Assignee: KONECRANES GLOBAL CORPORATION, Hyvinkää (FI)

( * ) Notice: Subject to any disclaimer, the term of this patent is extended or adjusted under 35 U.S.C. 154(b) by 242 days.

(21) Appl. No.: 14/433,010

(22) PCT Filed: Oct. 3, 2013

(86) PCT No.: PCT/FI2013/050957
§ 371 (c)(1),
(2) Date: Apr. 1, 2015

(87) PCT Pub. No.: WO2014/053704
PCT Pub. Date: Apr. 10, 2014

(65) Prior Publication Data
US 2015/0252861 A1    Sep. 10, 2015

(30) Foreign Application Priority Data
Oct. 3, 2012  (FI) ..................................... 20126034

(51) Int. Cl.
*G01R 31/02*    (2006.01)
*F16D 66/00*    (2006.01)
(Continued)

(52) U.S. Cl.
CPC ............ *F16D 66/00* (2013.01); *B60T 13/743* (2013.01); *B60T 17/221* (2013.01); *G01L 5/28* (2013.01);
(Continued)

(58) Field of Classification Search
CPC .... B66B 5/02; B66B 5/06; B66B 5/16; B60T 17/22; B60T 17/221; F16D 55/38;
(Continued)

(56) References Cited

U.S. PATENT DOCUMENTS 3,833,103 A * 9/1974 Stahle ..................... F16D 55/28
188/71.8
4,896,090 A    1/1990 Balch et al.
(Continued)

FOREIGN PATENT DOCUMENTS

CN    1042687 A    6/1990
CN    101224831 A    7/2008
(Continued)

OTHER PUBLICATIONS

DE 10149604 A1 Translation.*

*Primary Examiner* — Minh N Tang
(74) *Attorney, Agent, or Firm* — Birch, Stewart, Kolasch & Birch, LLP

(57) ABSTRACT

Monitoring a brake that includes first and second braking surfaces and a magnetizing device that, in response to the electric current supplied to them, are arranged to generate a magnetic field that is arranged to move the braking surfaces from a closed state, in which the braking surfaces are connected to each other, to an open state, in which the braking surfaces are separated from each other. Determining the electric current of the brake as the braking surfaces begin to move from the closed state to the open state, determining the maximum electric current of the magnetizing device of the brake in the open state, determining the condition of the brake as a current ratio from the electric current measured as the braking surfaces start to move to the maximum electric current.

33 Claims, 6 Drawing Sheets

(51) Int. Cl.
  *G01L 5/28* (2006.01)
  *B60T 13/74* (2006.01)
  *B60T 17/22* (2006.01)
  *G01R 19/10* (2006.01)
  *H02P 15/00* (2006.01)
  *F16D 65/38* (2006.01)
  *F16D 129/08* (2012.01)

(52) U.S. Cl.
  CPC ........ *G01R 19/10* (2013.01); *F16D 2065/386* (2013.01); *F16D 2066/006* (2013.01); *F16D 2129/08* (2013.01); *H02P 15/00* (2013.01)

(58) Field of Classification Search
  CPC ..... F16D 55/40; F16D 55/226; B16D 66/023; B16D 66/025; B16D 66/024; B16D 66/028
  See application file for complete search history.

(56) References Cited

U.S. PATENT DOCUMENTS

| | | | |
|---|---|---|---|
| 6,257,374 B1* | 7/2001 | Strzelczyk | B60T 17/221 188/1.11 E |
| 2003/0061872 A1 | 4/2003 | Giessler | |
| 2004/0138791 A1 | 7/2004 | Dewberry et al. | |
| 2011/0198167 A1* | 8/2011 | Huppunen | B60T 8/885 188/171 |

FOREIGN PATENT DOCUMENTS

| | | |
|---|---|---|
| DE | 3739836 A1 | 6/1989 |
| DE | 10149604 A1 | 4/2003 |
| EP | 2 399 799 A2 | 12/2011 |
| GB | 2202016 A | 9/1988 |
| GB | 2381052 A | 4/2003 |
| JP | 51-132539 A | 11/1976 |
| JP | 59-191402 A | 10/1984 |
| JP | 63-256160 A | 10/1988 |
| JP | 1-295793 | 11/1989 |
| JP | 6-239545 A | 8/1994 |
| JP | 11-60099 A | 3/1999 |
| JP | 2008-168981 A | 7/2008 |
| JP | 2009-20872 A | 1/2009 |
| SU | 1075031 A | 2/1984 |
| WO | WO 2009/024168 A1 | 2/2009 |

\* cited by examiner

BRAKE MONITORING

FIELD OF THE INVENTION

The present invention relates to monitoring a brake and in particular to monitoring an electromagnetic brake.

BACKGROUND

Brakes used in hoisting devices are critical to the operation of the hoisting device both in terms of economy and safety. The malfunction of a brake may lead to dropping the load, whereby other parts of the hoisting device may be damaged and there is a risk that the persons working close by will get hurt.

Brakes used in hoisting devices are conventional disc brakes, in which disc-like friction material rotating along with the motor axle presses between an anchor plate and a friction plate and deceleration takes place.

The friction surface wears during deceleration. If the friction surface wears out, the braking effect of the brake decreases significantly and the brake can no longer operate as designed. Thus, the brake malfunctions.

The condition of a brake is typically monitored manually by measuring the thickness of the friction surface with a slide gauge. So as to be able to measure the friction surface, a possible brake casing thus needs to be dismantled, and after the measurement and the possibly required brake maintenance, the casing needs to be closed again. Brake monitoring thus entails manual labour that is time-consuming and subject to errors. In addition, in hoisting devices, in which the brake is high up, as in harbour cranes, there is a risk that the maintenance person may fall, and taking this into account may further add to the time required to perform maintenance.

During the checking of the brake of the hoisting device, the production machine to which the brake is mounted is not available for use for its conventional work. A harbour crane under brake maintenance, for instance, is then out of use during the checking of the brake. However, in terms of economy, the downtime of an expensive apparatus like a harbour crane should be kept as rare and short as possible. Therefore, it is desirable that breaks in the operation of production machines be as short as possible. By scheduling the production breaks, it is possible to shorten the downtime, as the maintenance work can be planned better.

In terms of safety, the wear of a hoisting device brake causes a risk by increasing the probability of a malfunction of the brake, which may cause economic losses, if the hoisting device or its parts break or people in the vicinity of the hoisting device are hurt, or damage is caused to the production line or other property. For example, if the brake does not engage, the load of the hoisting device may fall. In another example, if the brake does not release, the motor of the hoisting device may run against the brake and the brake may overheat and even explode. Running against the brake refers to running the motor with the brake engaged, when the motor is normally switched off when the brake is engaged. Running against the brake may take place during the normal use of the brake, when the motor continues to run after the brake has been engaged.

Several brakes are typically used in hoisting devices to stop a load being handled and to keep it in place. In a hoisting device, the load can be moved in many different directions of movement. For instance, in harbour cranes, a container may be lifted and lowered using four ropes that connect to the corners of the container. The motor of each rope can be decelerated separately, which means that a number of brakes corresponding to that of the motors are needed, for instance four. In another example, in a bridge crane, the load is moved by means of a carriage, bridge and hoist in the directions of movement they permit. A safe movement of the load with the hoisting devices may, thus, require that the several brakes moving the load are in order. The maintenance of several brakes is challenging due to the number of brakes in the hoisting devices and/or the size of the hoisting devices. The challenge of the maintenance is further increased by the differences in the brakes, which may be due to the differences in the models of the brakes, when they originate from different manufacturers or are different models of the same manufacturer, for instance. Typically, the brakes of one and the same manufacturer may differ from each other in size and/or supply voltage.

BRIEF DESCRIPTION OF EMBODIMENTS

An object of the invention is, thus, to provide a method, device, computer program product, and arrangement so as to solve the aforementioned problems. The object of the invention is achieved by a method, device, computer program product and arrangement, which are characterised by what is stated in the independent claims. Preferred embodiments of the invention are disclosed in the dependent claims.

According to an aspect, a method for monitoring a brake is arranged, the brake comprising first and second braking surfaces and magnetizing means that, in response to the electric current supplied to them, are arranged to generate a magnetic field that is arranged to move the braking surfaces from a closed state, in which the braking surfaces are connected to each other, to an open state, in which the braking surfaces are separated from each other, the method comprising: determining the electric current of the brake as the braking surfaces start to move from the closed state to the open state, determining the maximum electric current of the magnetizing means of the brake in the open state, determining the condition of the brake as a current ratio from the electric current measured as the movement of the braking surfaces begins to said maximum electric current.

According to another aspect, a device is arranged for monitoring an electromagnetic brake, the brake comprising first and second braking surfaces and magnetizing means that, in response to the electric current supplied to them, are arranged to generate a magnetic field that is arranged to move the braking surfaces from a closed state, in which the braking surfaces are connected to each other, to an open state, in which the braking surfaces are separated from each other, the device being arranged to: determine the electric current of the brake as the braking surfaces start to move from the closed state to the open state, determine the maximum electric current of the magnetizing means of the brake in the open state, determine the condition of the brake as a current ratio from the electric current measured as the movement of the braking surfaces begins to said maximum electric current.

According to another aspect, a computer program product is arranged that comprises program instructions to make a device execute a method according to any aspect when downloaded into the device.

According to another aspect, a device is arranged that comprises means for performing a method according to any aspect.

According to another aspect, an arrangement is arranged that comprises a device according to any aspect.

According to another aspect, a method is arranged for upgrading a hoisting device that comprises an electromagnetic brake comprising first and second braking surfaces and magnetizing means that, in response to the electric current supplied to them, are arranged to generate a magnetic field that is arranged to move the braking surfaces from a closed state, in which the braking surfaces are connected to each other, to an open state, in which the braking surfaces are separated from each other, the method comprising the installation of a device according to any aspect to the electromagnetic brake.

Some embodiments may facilitate the monitoring of several different brakes, and the determination of their condition and/or maintenance need. The same threshold value for the current ratio can be set for different brakes, which simplifies the monitoring of several different brakes. This way, a device using different brakes can be kept in production for longer periods, which also means savings in the maintenance costs. Further advantages and/or benefits are disclosed in the following description, in which different embodiments are described in greater detail.

BRIEF DESCRIPTION OF THE FIGURES

The invention will now be described in more detail in connection with preferred embodiments and with reference to the accompanying drawings, in which.

DETAILED DESCRIPTION OF EMBODIMENTS

The following describes the monitoring of a brake. By monitoring the condition of a brake, it is possible to obtain information on the condition of the brake. This way, maintenance work of the brake can be scheduled before a malfunction occurs in the brake and it fails.

The invention is especially suitable for use in monitoring the condition of electromagnetic disc brakes. According to the invention, it is possible to implement a fixedly installed monitoring method and device, and on the basis thereof, it is also possible to build a portable monitoring device for maintenance personnel, for instance. The invention is capable of indicating wear and/or malfunction of a brake.

When it is detected that the condition of the brake has deteriorated, it is possible to apply predictive maintenance to the brake. Predictive maintenance is a maintenance method based on the actual condition of a device. The condition of the device or its component is measured by variables that change as parts wear. The measurement variables are defined limits, within which the device works in the desired manner, and when this limit is exceeded, the parts will be serviced or replaced.

In the following description, current ratio refers to the ratio of electric currents measured at different times from the magnetizing means of an electromagnetic brake. The electric current may be measured as the braking surfaces begin to move from their closed state to their open state and to the maximum electric current of the magnetizing means in the open state. The current ratio is obtained as the movement begins from the ratio between the measured electric current and the maximum electric current.

Figure 1:
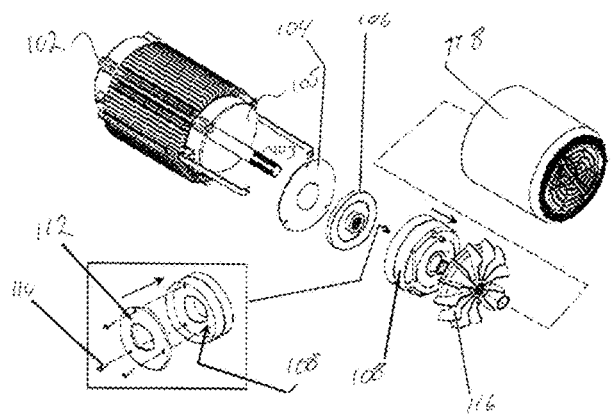
FIG. 1 shows an exploded view of a brake that is mounted to a motor of a hoisting device and can be monitored in accordance with the present embodiments.

FIG. 1 shows an exploded view of an electromagnetic brake that is mounted to a motor of a hoisting device and can be monitored in accordance with the present embodiments. FIG. 1 shows a motor 102 that is decelerated with a brake structure installed in it. The brake structure comprises a brake disc 106, friction plate 104 and brake frame 108. An anchor plate 112 is fastened to the brake frame 108 with screws 114, for instance. The brake structure also comprises a fan 116 and fan housing 118. The brake structure may be mounted in the motor 102, on the motor axle 103. The brake housing may extend to protect both the fan and the brake structure.

In a typical electromagnetic brake, the friction plate serves as a counter-piece when the brake is pressed closed. The movement of the friction plate when using the brake is small, or the friction plate does not move at all. The brake disc contains friction surfaces and is connected to the motor axle. This way, the brake disc rotates with the motor, when the brake is in the open state, and prevents the axle from rotating, when the brake is in the closed state. In the typical operation described above, the brake is assumed to be in order and to operate without problems.

The anchor plate of the brake is against the brake frame. In the closed state, springs press the anchor plate toward the brake disc and friction plate. The brake is released when a roll pulls the anchor plate toward the brake frame, whereby the brake disc is allowed to rotate freely in the open state.

When the brake is mounted on the motor axle, at least one of the braking surfaces of the brake, for instance the brake disc, may be mounted to rotate with the motor axle. When braking with the brake of FIG. 1, the braking surfaces press against each other, whereby the brake disc 106 is pressed between the friction plate 104 and anchor plate 112. The compression force may be achieved by springs, for example, as shown by springs 214 and 216 in FIGS. 2a and 2b.

Figure 2A:
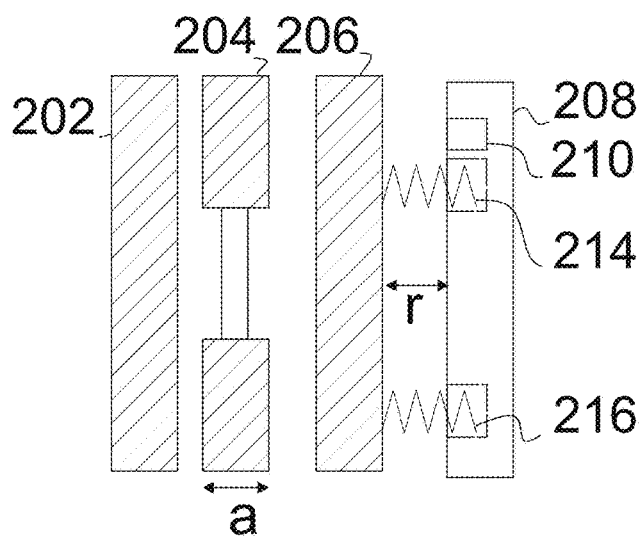
FIGS. 2a and 2b show a brake according to an embodiment in its different states.
Figure 2B:
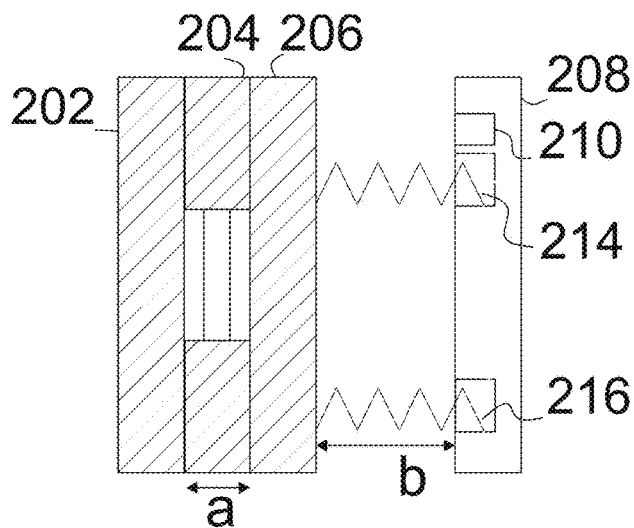

FIGS. 2a and 2b show a brake according to an embodiment in its different states. The states of a brake can be determined from the states of its braking surfaces. FIG. 2a shows a brake according to an embodiment with the brake released. FIG. 2b shows a brake according to an embodiment with the brake engaged.

The different states of the brake will now be described with reference to FIGS. 2a and 2b, in which the brake comprises a first 202, 206 and a second braking surface 204, and magnetizing means 210 that are arranged in response to electric current supplied to them to generate a magnetic field to move the braking surfaces from the closed state, in which the braking surfaces are connected to each other, to the open state, in which the braking surfaces 202, 204, 206 are separated from each other. When the braking surfaces are in the magnetic field generated by the magnetizing means, a force is directed to them to pull the braking surfaces separate. The braking surfaces are then open, as in FIG. 2a. When the braking surfaces are in the closed state, as in FIG. 2b, there is no magnetic field generated by the magnetizing means and the braking surfaces are pressed against each other.

The magnetizing means 210 may comprise a coil, magnet or some other device, for instance, that generates a magnetic field when electric current, such as direct current, is supplied to it. The magnetizing means may be mounted on a support structure 208 that may comprise the brake frame 108, for example, as in FIG. 1.

Springs 214 and 216 are fastened to the braking surface 206 to push the braking surface 206 toward the braking surfaces 202 and 204, whereby they press against each other, when current is not supplied to the magnetizing means and there is no magnetic field generated by the magnetizing means.

In FIG. 2a, electric current is supplied to the magnetizing means and they generate a magnetic field that generates to the braking surfaces a force that resists the force of the springs 214, 216 and thus keeps the braking surfaces separate from each other. The braking surface 206 is then at a distance r from the support structure 208. The springs 214 and 216 may be arranged to embed into the support structure 208, in which case the braking surface 206 can move to be against the support structure 208. In the open state, the braking surface 206 is against the support structure, for instance the brake frame. The distance r of the braking surface 206 to the support structure can be made as small as possible, r=0.

In FIG. 2b, electric current is not supplied to the magnetizing means, so they do not generate a magnetic field to pull the braking surfaces separate from each other. The braking surfaces 206, 204, 202 then press together under the force of the springs 214 and 216 and an air gap b is formed between the braking surfaces and the brake frame 208 from the anchor plate to the brake frame. A typical air gap b is in the range of 0.4 to 1.2 mm. The brake then works in the desired manner, that is, its braking effect is not diminished. When the air gap b in the brake widens, the braking surfaces move away from the magnetizing means, and the force of the magnetic field generated by the magnetizing means and directed to the braking surfaces diminishes. As a consequence, even more electric current needs to be supplied to the magnetizing means to produce a force to the braking surfaces that moves them from the closed state to the open state. At worst, the air gap b is so wide that the braking surfaces 204, 206 do not open completely or at all, in which case running against the brake is possible. When the air gap is too wide, the coil may not be able to pull the brake open.

If the air gap is wider than a typical air gap in the brake, the brake disc of the brake is worn and needs to be replaced to achieve the desired operation of the brake. The brake may then be defined as malfunctioning. If the air gap exceeds the desired level, it is possible that the brake is in contact in an undesired manner even during driving. This may lead to energy loss, brake material wear and/or glazing as well as to the brake accumulating dust.

Deceleration wears the friction material of the brake disc and thus widens the air gap of the brake. The air gap of the brake refers to the air gap, b, inside the brake, when the brake is engaged. During release, the magnet of the brake pulls the anchor plate away from the brake disc, thus enabling the free rotation of the motor. If the air gap is too wide, the magnetizing means cannot pull the anchor plate to them and the brake does not release. This may also be caused by a faulty adjustment of the air gap.

The air gap may also be too narrow. If the air gap is too narrow, the brake cannot release properly, whereby driving against the brake may occur at least to some extent. Too narrow an air gap may also be caused by a faulty air gap adjustment.

In an embodiment, it is possible to determine the wear of the friction material of the brake from the current ratio measured from the magnetizing means of the brake. The measuring of the current ratio will be described in more detail later on. For instance, in FIG. 2a, the wear of the braking surface 204 may be detected as an increase in the air gap b of the brake. The thickness of the friction material may determine the condition of the brake. In an extreme case, the friction material may be worn out, in which case the brake is faulty and malfunctions. The air gap is then at its widest and exceeds the highest value, 1.2 mm, of the typical air gap in a brake, for example. In the other extreme, the condition of the brake is new or corresponding to new, when the thickness of the friction material is at its maximum. The air gap is then at its narrowest, for instance at the lowest limit, 0.4 mm, of the above-mentioned typical air gap.

In a brake disc, the thickness of the material may be 11.15 mm when new and 10.4 mm when worn out. This thickness of the material is the total of the thicknesses of the iron material of the brake disc and the friction material on both sides. The proportions of the material thicknesses (friction: iron:friction) in the wear direction are approximately 1:1:1.

In an embodiment, the braking surface 202 may be a friction plate 104, the braking surface 204 may be a brake disc 106 and the braking surface 206 may be an anchor plate 112, as in FIG. 1. The brake disc is preferably made of a material with a high friction coefficient so that when the brake is engaged in FIG. 2b, braking is effective. When the braking surfaces are in the closed state, in FIG. 2b, the anchor plate presses the brake disc against the friction plate, whereby all braking surfaces are against each other. The brake disc is then pressed between the anchor plate and friction plate, thus combining the force between the anchor plate and friction plate.

In the situation of FIG. 2b, the monitoring of the condition of the brake is possible by using prior-art means by measuring the air gap b of the brake with a clearance gauge. The air gap b is then the direct distance between the braking surface 206 and brake frame 208.

Figure 3A:
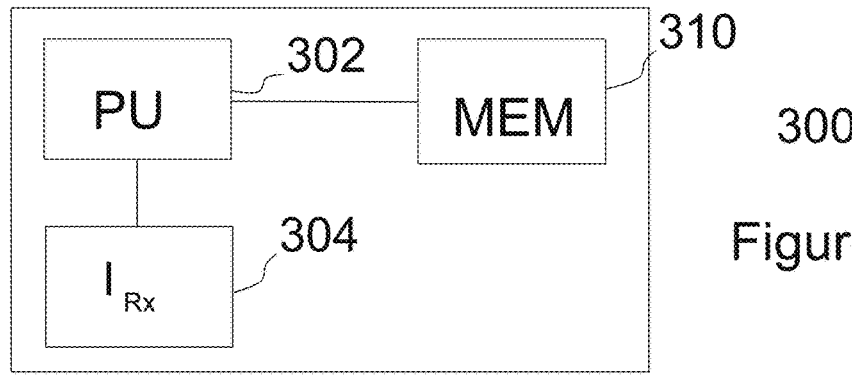
FIGS. 3a and 3b show devices for monitoring the condition of a brake according to some embodiments.
Figure 3B:
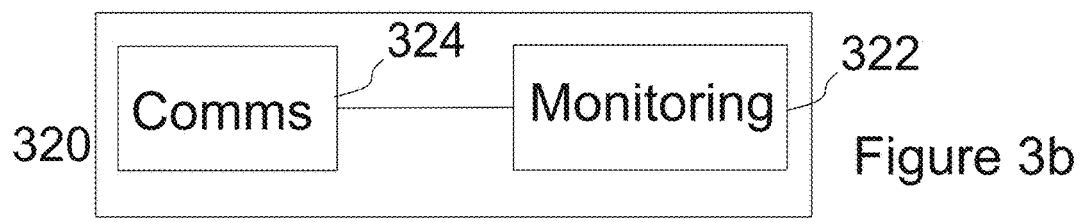

FIGS. 3a and 3b each show a device for monitoring the condition of a brake according to an embodiment. Even though the devices are shown as one unit, different modules and memory can be implemented as one or more logical units.

The device 300 of FIG. 3a comprises a processing unit 302, memory 310 and means 304 for receiving electric current from the magnetizing means of an electromagnetic brake. All units are electrically connected to each other. The memory may contain one or more programs that are executable by the processing unit. The processing unit may act under the control of program instructions stored in the memory and receive information concerning the electric current running in the magnetizing means of the electromagnetic brake to, thus, determine the condition of the brake. This way, the processing unit, memory and means for receiving electric current from the magnetizing means of the electromagnetic brake can form means for determining the condition of the electromagnetic brake.

The means 304 for receiving electric current from the magnetizing means of the electromagnetic brake transfer information on the magnitude of the received current as an electric signal to the processing unit 302. The processing unit may determine the magnitude of the received current from the received electric signal as an electric quantity. The electric quantity being determined may be voltage or electric current, for example.

In an embodiment, the means for receiving electric current from the magnetizing means of the electromagnetic brake comprise a galvanic coupling circuit that supplies electricity to the magnetizing means, such as coil, of the brake. In another embodiment, the means for receiving electric current from the magnetizing means of the electromagnetic brake comprise means for receiving energy from a magnetic field generated by the magnetizing means of the brake. The magnetic field of the brake can be received by a device which is brought close to the brake and in which the magnetic field of the brake induces current. Preferably, the means for receiving electric current from the magnetizing means of the electromagnetic brake comprise a non-galvanic coupling circuit that supplies electricity to the magnetizing means, such as coil, of the brake. This type of device is for example a receiver that receives the energy of the magnetic field and is arranged around a conductor supplying current to the magnetizing means of the brake. This way, the current running in the conductor can be measured on the basis of the magnetic field it generates.

The processing unit may contain a set of registers, an arithmetic logic unit, and a control unit. The control unit is controlled by a sequence of program instructions that are transferred to the processing unit from the memory. The control unit may contain numerous microinstructions for basic functions. Implementation of the microinstructions may vary depending on the configuration of the processing unit. The program instructions may be encoded in a programming language, which may be a high-level programming language, such as C or Java, or a low-level programming language, such as a machine language or assembler. The memory may be a volatile memory or non-volatile memory, such as EEPROM, ROM, PROM, RAM, DRAM, SRAM, firmware, and programmable logic.

The device 320 of FIG. 3b comprises a device 322 for monitoring an electromagnetic brake, for example the device 300 of FIG. 3a. Data transmission means 324 for transmitting and/or receiving information are electrically connected to the device 322 for monitoring the electromagnetic brake. The data transmission means may comprise a modem unit, for instance, for providing data transmission between the network and device 320. The network may be a wireless network, in which information is transmitted wirelessly on the radio frequency band of the network. The data transmission means may then comprise necessary means for radio-frequency data transmission, for instance an antenna, for transforming the information between the radio frequency band and baseband.

An embodiment provides a computer program on a distribution medium and comprising program instructions that when downloaded into an electronic device make the processing unit execute an embodiment according to the present invention.

The computer program may be in source code format, object code format or in an intermediate format, and it may be stored on a transfer medium that may be any entity or device that is capable of storing the program. Transfer media of this type include a storage medium, computer memory, read-only memory, electric carrier wave, data communications signal and software distribution package, for instance.

The device 300 can also be implemented as one or more integrated circuits, such as an application specific integrated circuit, ASIC. Other implementations are also possible, such as a circuit made of separate logic components. A hybrid of these different implementation alternatives is also possible. An example of circuits made of logic components is the FPGA (Field Programmable Gate Array) circuit.

It is apparent to a person skilled in the art that the devices shown in FIGS. 3a and 3b may also contain other parts than those described above, but which are not essential to the invention and have, therefore, been left out to make the presentation clearer.

In an embodiment, the devices of FIGS. 3a and 3b may contain a display device, such as an LCD (Liquid Crystal Display) screen. The display device may be a touch screen, in which case instructions may be received from the user through the screen. Other data input means can also be used with the display device. The data to be input may comprise a threshold value of the current ratio for one or more brakes, for instance. The received information on the threshold value may be stored in memory and used in monitoring the brakes.

The display device can be connected over an electric coupling, for example, to the processing unit that may through the coupling control the screen to display information on the condition of one or more brakes. Information on the condition of the brake may comprise the condition level of the brake and/or the current ratio measured from the brake, which the processing unit has calculated according to instructions which have been stored in the memory, for instance, and which may comprise a threshold value for the current ratio. Further, from the current ratio of the brake, the processing unit may calculate a maintenance time of the brake, which may comprise the service life of the brake. History data of the current ratio of the brake as well as an estimate on the future values of the current ratio may be used in calculating the maintenance time. The service life can be defined as a number of decelerations, a date, a number of days, or a combination of these, for instance. The number of decelerations can be calculated cumulatively from the previous maintenance, for example, or it is possible to calculate the remaining number of decelerations before the brake requires maintenance. Like the number of decelerations, the number of days can be calculated cumulatively starting from the previous maintenance or as days remaining before maintenance. The date may comprise the date of the maintenance.

Figure 4A:
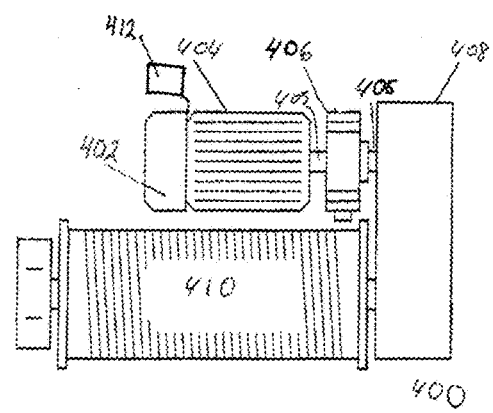
FIG. 4a shows a hoisting device with an electromagnetic brake that is monitored according to an embodiment.

FIG. 4a shows a hoisting mechanism 400 with an electromagnetic brake 402 that is monitored according to an embodiment. In the hoisting mechanism of FIG. 4a, load lifting means 410, such as a rope drum, is functionally connected to the electromagnetic brake 402 by power transmission means 405, 408.

The motor 404 of the hoisting mechanism generates a mechanical rotating movement that is transmitted to the rope drum 410 through the power transmission means. The power transmission means 405 may comprise a motor axle 405, for instance, with which power coupled to the rotating movement of the axle is transmitted from the motor. When the motor axle rotates, the rotating movement of the axle is transmitted to the devices, such as rope drum 410, coupled to it. When the motor drives the rope drum in this manner, the load coupled to the rope drum moves.

In an embodiment, the power transmission means comprise a motor axle 405 and transmission gear 408, with which the power from the motor can be set to drive the load lifting means 410 to either lift or lower the load. In addition, the motor can be used to adjust the velocity, by which the load lifting means move the load.

The hoisting mechanism 400 may comprise a coupling 406, with which the motor can be coupled to the transmission gear 408. After the motor has been coupled to the transmission gear, the power of the motor can be transferred to the rope drum 410 and the load moved.

In an embodiment, the hoisting mechanism comprises a brake 402 that is coupled to the motor, whereby the brake may decelerate and/or stop the mechanical movement transmitted from the motor or load lifting means to the power transmission means. The brake may be coupled to the motor axle, for example, as shown in FIG. 1, where the brake disc is installed on the motor axle. In such a case, during braking, the braking surfaces shift into the closed state shown in FIG. 2b, whereby the brake resists the movement transmitted from the axle.

In an example, the movement of the power transmission means may originate from the motor, when it is running and provides the mechanical rotating movement of the axle. The movement may also originate from the hoisting mechanism that is coupled to the axle through the transmission gear, for instance, and provides to it a mechanical force, the magnitude of which is determined by the mass of the load connected to the hoisting mechanism. When the motor is running and runs the power transmission means with the brake engaged, the motor may be said to run against the brake.

In an embodiment, the hoisting mechanism 400 comprises a monitoring device 412 for monitoring the condition of the brake. The monitoring device may be the monitoring device shown in FIGS. 3a and 3b, for instance.

Figure 4B:
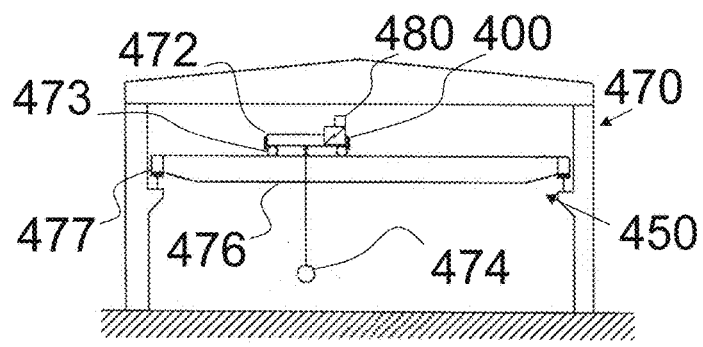
FIG. 4b shows a hoisting device with an electromagnetic brake that is monitored according to an embodiment.

FIG. 4b shows a hoisting device 450 with an electromagnetic brake that is monitored according to an embodiment. The hoisting device of the example in FIG. 4b is a bridge crane that is shown in its operating environment, which in this example is a storage building 470. The bridge crane comprises a bridge 476 with a carriage 472 mounted on top. The carriage comprises a hoisting mechanism 400 for lifting and lowering a load. The hoisting mechanism may be as shown in FIG. 4a, for instance, with a monitoring device 480, like that shown in FIGS. 3a and 3b, installed in it. The carriage is movable between the walls of the storage building. The bridge is movable in the depth direction of the storage building. This way, the load 474 coupled to the bridge crane can be moved with the hoisting mechanism 400, carriage and/or bridge in their travel directions. As described above in connection with FIG. 4a, the hoisting mechanism 400 comprises a brake. In addition to the brake of the hoisting mechanism, the bridge crane also comprises a brake 477, which when engaged stops the movement of the bridge. The bridge crane further comprises a brake 473, which when engaged stops the movement of the carriage. The above-mentioned brakes may all be electromagnetic brakes that are monitored by a monitoring device 480. The brakes of the hoisting mechanism, bridge, and carriage each decelerate the movement of the respective parts.

Figure 5:
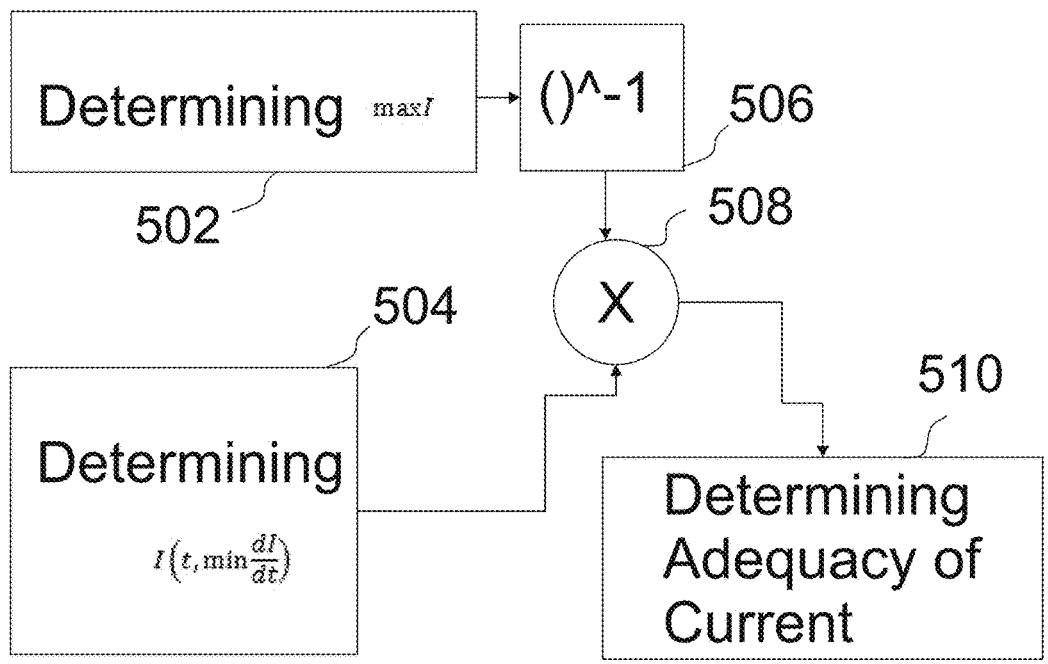
FIG. 5 shows an operational block diagram for monitoring a brake.

In an embodiment, several electromagnetic brakes 402, 477, 473 are monitored on the basis of the same current ratio threshold value. The current ratio can be determined as shown in FIG. 5, block 508. Because, in monitoring several brakes, it is possible to use the same current ratio threshold value, such as the current ratio threshold value that corresponds to the condition level of the brake as described in FIG. 5, block 510, it is easier to monitor the brakes of the hoisting device. The condition level of the brake defines for each brake a maintenance requirement, whereby the monitoring of several different brakes in the hoisting device becomes easier.

FIG. 5 shows an operational block diagram for monitoring a brake. The brake may, for instance, be the electromagnetic brake described in the embodiments shown in FIGS. 2a and 2b.

The monitoring of the brake may comprise the monitoring of the condition of the brake on the basis of the wear of the braking surfaces. As a result of the wear of the braking surfaces, the air gap b between the braking surface 206 and brake frame 208 becomes wider when the brake is in the closed state.

In an embodiment, the monitoring of the condition of the brake comprises monitoring the adequacy of the electric current supplied to the brake on the basis of the current ratio. The current ratio can be defined as the ratio of electric current measured when the movement of the braking surfaces begins in relation to the maximum electric current of the magnetizing means in the open state of the brake.

In an embodiment, the hoisting device, such as that shown in FIG. 4b, is updated with the monitoring device according to FIG. 3a or 3b or with computer software that implements the functions of the monitoring device. The monitoring device can be installed on the hoisting device, as shown in FIG. 4a. If the hoisting device has several brakes, separate monitoring devices may be installed to monitor each of them. The computer software may be stored in the memory of the hoisting device, whereby it can be run all the time or timed for selected time instants. This way, old equipment and hoisting devices already in use can be monitored in accordance with the invention.

The block diagrams shown in FIG. 5 can be implemented by the devices of FIGS. 3a and 3b, for instance, which contain means for receiving electric current from the magnetizing means of the brake, and the processing unit may thus perform the operations of the block diagram in FIG. 5 on the basis of the information provided by the devices connected to it.

In block 502, the maximum electric current of the magnetizing means of the brake is determined in the open state. The maximum electric current can be determined as the greatest electric current of the magnetizing means, when the brake is moved from the closed state of FIG. 2b to the open state of FIG. 2a. To determine the maximum electric current, the monitoring device is connected to receive information on the current running in the circuit of the magnetizing means. The connection may be implemented either galvanically or non-galvanically, as described in connection with FIG. 3a. Measuring the electric current of the magnetizing means can be started simultaneously as the brake is given a control command to release it. The measuring may take 1 s, for instance, during which time a typical brake releases. The highest electric current value, in amperes (A), for example, detected during measuring defines the maximum current of the brake.

In block 504, the value of the electric current supplied to the magnetizing means of the brake is determined, when the braking surfaces start to move from the closed state to the open state. The value can be presented as amperes (A), for instance. The starting time of the movement may be determined from the vibration of the brake by sensors, for example.

In an embodiment, the start of the movement of the braking surfaces from the closed state to the open state is determined on the basis of a time derivative of the electric current measured from the magnetizing means of the brake. The time derivative defines a change in the electric current as a function of time. As a result of the movement of the braking surfaces, an electric current that is opposite to that supplied to the magnetizing means is induced to the magnetizing means. The increase in the electric current measured from the magnetizing means then slows down, stops, or the values of the electric current even decrease.

The movement of the braking surfaces stops, when the brake is released, as shown in the situation of FIG. 2a. After this, the value of the electric current increases continuously up till its maximum value. The slowing down, stopping, and decreasing of the increase in the electric current can be defined from the time derivative of the electric current on the basis of a local minimum point of the time derivative. The starting of the movement of the braking surfaces is preferably defined on the basis of a local minimum point of the time derivative of the electric current. Measuring the time derivative of the electric current is independent of the wear degree of different brakes and/or brake. This way, monitoring the condition of different brakes having different degrees of wear is simple.

Figure 7A:
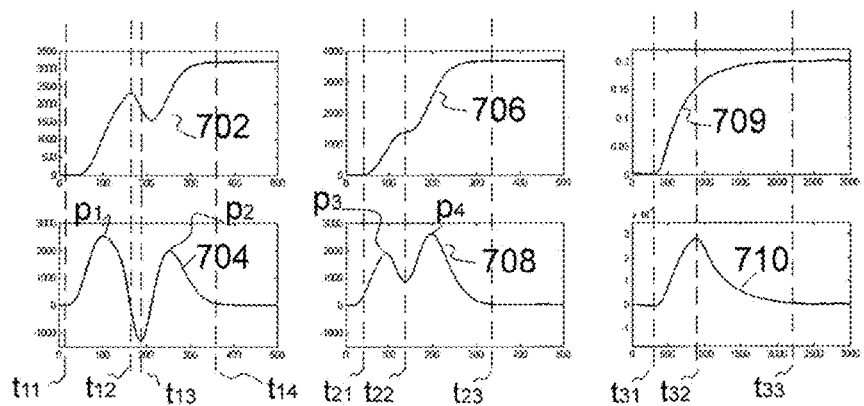
FIG. 7a illustrates different electric currents measured from magnetizing means of an electromagnetic brake as a function of time, and time derivatives of the measured electric currents in accordance with an embodiment.

When the electric current decreases as a result of the movement of the braking surfaces, as in curve 702 of FIG. 7a after time instant $t_{12}$, the peak value of the electric current is formed at time instant $t_{12}$ that precedes the decrease in the value of the electric current and the minimum point of the time derivative of the electric current at time instant $t_{13}$.

When the increase in the electric current slows down or stops as a result of the movement of the braking surfaces, as in curve 706 after time instant $t_{21}$ before the local minimum point of the time derivative 708 at time instant $t_{22}$, the peak value of the electric current is formed at time instant $t_{22}$ of the local minimum of the time derivative. It should be noted that as the increase in the electric current stops and/or remains almost the same, the minimum of the time derivative of the electric current is at the time period corresponding to the stopping, in which case the peak value of the electric current can be defined as a peak value at that time period of the time derivative.

With reference to FIG. 5, the ratio of the electric current defined 504 in the block to the maximum electric current defined in block 502 is defined in blocks 508 and 506. The ratio can be defined 508 by calculating in block 506 an inverse to the maximum electric current defined in block 502 and by multiplying the inverse calculated in block 506 by the electric current defined in block 504.

Block 508 produces the current ratio, on the basis of which the adequacy of the electric current supplied to the brake is defined 510.

In an embodiment, the adequacy of the electric current supplied to the brake for releasing the brake is defined in block 510.

In an embodiment, the adequacy of the electric current supplied to the brake is defined on the basis of one or more threshold values th in block 510. The threshold value may define the condition level of the brake. The brake may have several condition levels, in which case a threshold value corresponds to each condition level. The condition level may comprise the following levels, for instance: "in order", "needs maintenance", "defective". When the current ratio exceeds the threshold value, the condition level corresponding to the threshold value th defines the condition of the brake.

FIG. 7a illustrates different electric currents measured from the magnetizing means of an electromagnetic brake as a function of time, and time derivatives of the measured electric currents in accordance with an embodiment. The electric currents can be measured with the devices of FIG. 3a or 3b, for example. In the figure, curves 702, 706, and 709 show electric currents measured from different brakes or from the same brake at different degrees of wear, and curves 704, 708, and 710 show the corresponding time derivatives of curves 702, 706, and 709. In curves 702, 706, and 709, electric current has been measured when the braking surfaces are moved from the closed state of FIG. 2b to the open state of FIG. 2a. Current is not supplied to the magnetizing means of the brakes for moving the braking surfaces during the time before time instants $t_{11}$, $t_{21}$, and $t_{31}$. Electric current is supplied to the magnetizing means starting from time instants $t_{11}$, $t_{21}$, $t_{31}$.

At time instant $t_{12}$, curve 702 of the electric current reaches its highest value thus far before the value of the electric current begins to decrease. The highest value of the electric current at time instant $t_{12}$ is reached before the local minimum value of the time derivative of curve 702 at time instant $t_{13}$.

Curve 706 continues to increase between time instants $t_{21}$ and $t_{22}$, when the time derivative 708 corresponding to the curve is higher than or equal to zero. The highest value of curve 706 from time instant $t_{21}$ to time instant $t_{22}$ of the local minimum value of the derivative of the curve is obtained at time instant $t_{22}$ of the local minimum value of the derivative.

The local minimum of the time derivative can be defined on the basis of the change in the consecutive values of the time derivative. Consecutive values of the time derivative can be formed by sampling the time derivative, for instance, in which case the local minimum can be defined for a time instant, when the middle one of three temporally consecutive samples is smaller than the first and last samples. In FIGS. 704 and 708, the local minimum of the time derivative is at a moment that is between the peaks $p_1$, $p_2$, $p_3$, $p_4$ of the time derivative curves. The local minimum of the time derivative curve 704 is at time instant $t_{13}$, at which time the value of the time derivative is smaller than the sample before or after time instant $t_{13}$, for instance peak $p_1$ preceding the local minimum and peak $p_2$ following the local minimum. The local minimum of the time derivative curve 708 is at time instant $t_{22}$, at which time the value of the time derivative is smaller than the sample before or after time instant $t_{22}$, for instance peak $p_3$ preceding the local minimum and peak $p_4$ following the local minimum.

Even though the definition of the time instant of the time derivative local minimum is described above by using three samples, it is also possible to use more samples than this for the definition of the time derivative, whereby misinterpretations caused by interference of the measuring signal can be avoided and the precision of the definition thus improved. For instance, the time instant of the local minimum can be defined to be at an instant, when the sample is smaller than five samples before and after it.

In an embodiment, curves 702 and 706 depict electric currents measured from different electromagnetic brakes. Electromagnetic brakes may differ in their electric and/or magnetic properties. Electric properties may also differ in terms of the voltage (volts), current (amperes) and/or impedance (ohms) of the electric current supplied to the brake. The magnetic properties may differ in the materials and/or size of the brake parts. As a result of the differences, different electromagnetic brakes require currents of different magnitude to generate the magnetic field moving the braking surfaces.

Generally, the curves of the electric currents measured from the magnetizing means of electromagnetic brakes can change as the braking surfaces of the brakes wear. When the braking surfaces wear, the air gap in the electromagnetic brake widens. The distance between the braking surfaces and magnetizing means also increases and a stronger magnetic field is required to move the braking surfaces from the closed position of FIG. 2b to the open position of FIG. 2a.

In FIG. 7a, the starting moment of the movement of the braking surfaces is determined on the basis of time instants $t_{12}$ and $t_{22}$. When the braking surfaces start to move from the closed position to the open position, an opposite-direction current is induced on the magnetizing means of the electromagnetic brake and its effect on the electric current to be measured is at its greatest at time instants $t_{13}$ and $t_{22}$ of the local minimum of the time derivative of each electric current curve. When the movement of the braking surfaces ends, an opposite-direction current is no longer induced on the magnetizing means. As a result of this, the electric current measured from the magnetizing means increases, as can be seen in curves 702 and 706 as an increase in the electric current after the local minimum $t_{13}$, $t_{22}$ of the time derivative.

Curve 709 increases continuously between time instants $t_{31}$ and $t_{33}$. At time instant $t_{33}$, curve 709 reaches its maximum value. The time derivative 710 of curve 709 does not have a local minimum value between time instants $t_{31}$ and $t_{33}$, as opposed to the time derivatives of curves 702 and 706 at time instants $t_{13}$ and $t_{22}$. Because no local minimum is formed in the time derivative of curve 709, it can be determined that the braking surfaces did not open. Instead of the local minimum, the time derivative displays only one peak $t_{32}$ between time instants $t_{31}$ and $t_{33}$. The releasing of the brake has then not produced the electric current opposite to the current supplied to the magnetizing means and induced to the magnetizing means as a consequence of the movement of the braking surfaces, which opposite electric current would be detected as a slowing down or stopping of the increase in the electric current or even as a decrease in the value of the electric current in the curve form of the electric current between time instants $t_{31}$ and $t_{32}$. On the basis of curve 709 and its time derivate, it is possible to determine that the braking surfaces have not moved much or at all from the closed state. In other words, the brake is engaged. In the case of the brake corresponding to curve 709, the electric current supplied to the magnetizing means of the brake is, thus, not sufficient to release the brake. Curve 709 and its time derivative are typical of a worn brake.

In the brake shown by curve 702, the movement of the braking surfaces can be detected as a decrease in electric current between time instants $t_{12}$ and $t_{13}$. In the brake shown by curve 706, the starting moment of the movement of the brake surfaces can be detected as a slowing down of the increase in electric current before the time derivative of the electric current reaches its local minimum at time instant $t_{22}$. Curve 706 grows continuously after time instant $t_{22}$ until the electric current reaches its maximum value. The starting moment of the movement can be determined from curve 702 at the moment preceding the local minimum value of the time derivative of the electric current and when the electric current has reached its highest value. A separate peak of electric current can then be seen in curve 702, and the values of the electric current on both sides of time instant $t_{12}$ of the peak value are smaller than the peak value.

Curve 706 shows no separate peak, before and after which the value of the electric current is smaller than the value of the electric current at the peak. The starting moment of the movement of the braking surfaces can then be defined as time instant $t_{22}$, at which the time derivative of the electric current has a local minimum.

In an embodiment, curves 702 and 706 can show electric currents measured from the same brake and derivatives 704 and 708 of the measured currents. Curves 702 and 704 then represent a brake, in which the braking surfaces are more worn than in curves 706 and 708 measured from the same brake before the braking surfaces were worn. As a result of the wear of the brake, a separate peak can be detected in curve 702 of the electric current at time instant $t_{12}$.

In an embodiment, curves 702 and 706 can show electric currents measured from different brakes and derivatives 704 and 708 of the measured currents. The brakes may differ in their electric properties, magnetic properties and/or size, for instance. Curves 702 and 704 then typically represent curves measured from the bigger brake, whereas curves 706 and 708 represent curves measured from the smaller brake.

Figure 7B:
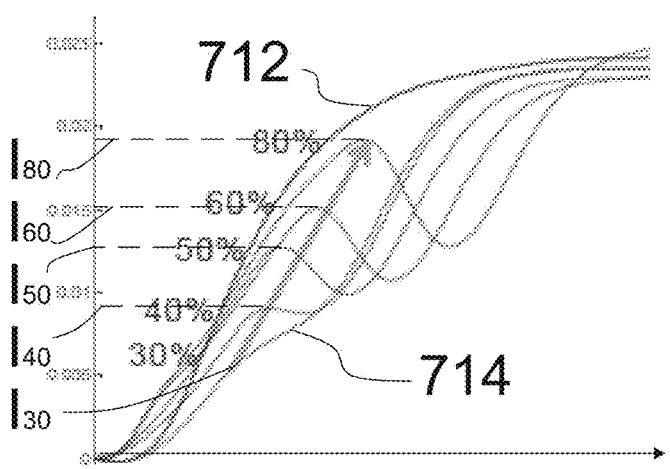
FIG. 7b illustrates the condition of an electromagnetic brake by means of electric current measured from the magnetizing means of the electromagnetic brake and a current ratio calculated for the brake.

FIG. 7b illustrates the condition of an electromagnetic brake by means of electric current measured from the magnetizing means of the electromagnetic brake and a current ratio calculated for the brake. The current ratio is formed, when the movement of the braking surfaces begins, of the ratio of the measured electric current to the maximum electric current in the open state of the brake.

The figure shows the electric currents measured from the magnetizing means of the brake, in which curve 714 represents a brake that is not substantially worn, such as a new brake. Curve 712 represents a worn brake. Curves 712 and 714 grow continuously, in which case consecutively measured electric current values are either higher than each other or essentially equal in size. The derivative of the electric current of curve 714 is then always positive, like curve 706 of the electric current and its derivative 708 in FIG. 7a. The time derivative of curve 712 follows the time derivative 710 of curve 709 in FIG. 7a, which is typical of a worn brake that does not release.

The wear of the brake is seen in the electric currents measured from the brake, when the brake has been worn. FIG. 7b shows different electric currents measured from the magnetizing means of an electromagnetic brake as well as current ratios at different degrees of wear of the brake in accordance with an embodiment. Curve 714 showing a 30% current ratio corresponds to the smallest wear of the brake and the curve showing an 80% current ratio corresponds to the biggest wear of the brake. The curves of 40%, 50% and 60% current ratios correspond to the growing wear of the brake. The current ratio curves of 30%, 40%, 50%, 60% and 80% reach their first peak value, when the braking surfaces are being opened from the closed position. The peak value, $I_{30}$, $I_{40}$, $I_{50}$, $I_{60}$ and $I_{80}$, corresponding to each electric current curve is illustrated on the vertical axis in FIG. 7b. An increasing wear of the brake thus increases the electric current required for the movement of the braking surfaces to start, in which case the peak values $I_{30}$, $I_{40}$, $I_{50}$, $I_{60}$ and $I_{80}$ get bigger as a result of the wear of the brake. The electric current curves corresponding to 40%, 50%, 60% and 80% current ratios and their derivatives follow the shape of the electric current curve 702 and its derivative 704 of FIG. 7a, in which the peak of the electric current at time instant $t_{12}$ precedes the local minimum at time instant $t_{13}$. When the braking surfaces move after time instant $t_{12}$, the value of the electric current decreases due to the opposite-direction current induced by the moving braking surfaces. When the derivative of the electric current reaches its minimum at time instant $t_{13}$, the movement of the braking surfaces has stopped. After this, the electric current increases toward the maximum value of the electric current.

In an embodiment, the starting moment of the movement of the brake is defined as a maximum of the electric current at the time instant of the local minimum of the time derivative of the brake current or at a time preceding the local minimum. This value of the electric current can be used in block 504 of FIG. 5. The local minimum follows the start of the brake movement from the closed state to the open state, as seen from time instants $t_{12}$ and $t_{13}$ and $t_{22}$ of FIG. 7a.

In an embodiment, as the braking surfaces begin to move from the closed state to the open state, the electric current is defined as a value of the electric current measured from the magnetizing means of the brake at a moment when the time derivative of the electric current is at its local minimum after the start of the movement of the braking surfaces. It is then possible to also determine the current ratio of small brakes, new brakes and/or worn brakes, even though the electric current being measured does not decrease as a result of the start of the movement, as shown by curve 706 in FIG. 7a and curve 714 of FIG. 7b.

By means of the local minimum of the time derivative of the electric current, the definition of the electric current, as the braking surfaces begin to move from the closed state to the open state, becomes easier. This way, the current ratio can be determined for the starting moment of the movement of the braking surfaces, when the maximum current is also known. This way the current ratio can also be obtained for the brake, even though its electric current increases continuously, and no separate peak points are detected before the maximum current, as in curve 706 of FIG. 7a.

The maximum value of the electric current of curve 702 follows the minimum of the time derivative at time instant $t_{13}$ and is reached at time instant $t_{14}$. Between $t_{14}$ and $t_{13}$, the curve of the electric current grows continuously.

Correspondingly, the maximum value of the electric current of curve 706 follows the minimum of the time derivative at time instant $t_{22}$ and is reached at time instant $t_{23}$. Between $t_{21}$ and $t_{23}$, the curve of the electric current grows continuously.

The maximum value of the electric current of curve 709 is reached at time instant $t_{33}$, which follows the peak of the derivative at time instant $t_{32}$.

In an embodiment, the electric current of the magnetizing means of the brake, as the braking surfaces being to move, is determined on the basis of the time derivative of the magnetizing means. The value of the electric current at the time the braking surfaces start to move can be defined as the value of the electric current as the maximum electric current at the time preceding the local minimum of the time derivative, as in FIG. 704, or the value of the electric current at the local minimum of the time derivative, as in FIG. 708.

Figure 6:
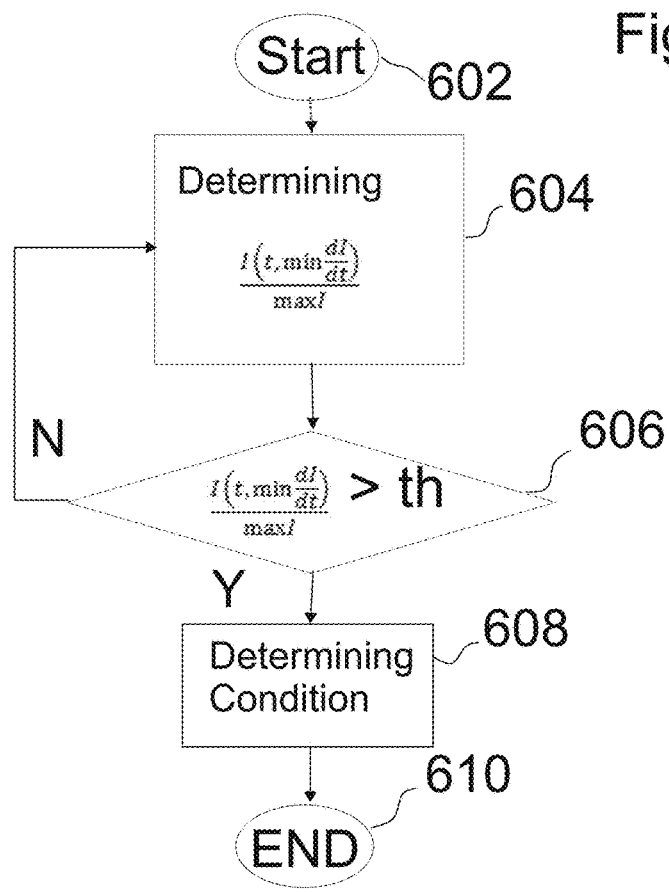
FIG. 6 shows a method for monitoring the condition of a brake according to an embodiment.

FIG. 6 shows a method for monitoring the condition of a brake according to an embodiment. The method can be performed with the monitoring device for the condition of a brake shown in FIGS. 3a and 3b. The brake being monitored may be the electromagnetic brake shown in the above embodiments.

The method starts in step 602, in which the monitoring device is connected to the brake to receive the current supplied to the magnetizing means of the brake. The monitoring device can be connected to a circuit supplying electric current, such as a conductor of a circuit. The connection may be galvanic or non-galvanic. A galvanic connection may be implemented by a shunt resistance, for example. A non-galvanic connection may be implemented by a magnetic field receiver mounted around the conductor.

Step 604 defines the ratio of the electric current defined, when the braking surfaces begin to move from their closed state to their open state, to the maximum electric current of the magnetizing means of the brake in the open state. This can be done as described in FIG. 5, blocks 508 and 506, for instance. In defining the electric current, the electric current supplied to the magnetizing means of the brake can be measured during a suitable time, 1 s, for instance, during which the brake releases. The values of the measured electric current can further be sampled and processed in ways for determining the maximum current, current ratio, and time derivative of the electric current known by a person skilled in the art.

The ratio of the electric current can be compared 606 with a threshold value th. The threshold value may comprise a threshold value for the current ratio, 80% for example. The threshold value may be the same for several brakes that are different in their electric and/or magnetic properties, for instance. Thus, the threshold value is not dependent on the size of the brake, but it is a percentage, for instance, and the same percentage can be used in brakes of different sizes and of different manufacturers. The threshold value may be set by the client, for instance the user of the harbour crane, in which case the same threshold value is used in all brakes of the harbour crane. When the current ratio defined in step 604 exceeds the threshold value th, the method continues to step 608. If the threshold value is not exceeded 606, the method can continue to step 604, in which the current ratio of the brake can be further monitored.

In step 608, the condition of the brake is determined. The condition of the brake can be determined on the basis of the current ratio defined in step 604. The condition of the brake can be determined as described in block 510 of FIG. 5. When the condition of the brake has been determined 610, the method ends. The method could continue with a definition of a brake maintenance plan, for instance. This can be done on the basis of the condition of the brake. The maintenance plan may include the definition of a maintenance time of the brake, definition of the maintenance cycle and/or calculation of service life.

It should be noted that even though the method has above been described for one brake, it is possible to use the method for monitoring several brakes that may differ from each other. The method can then be used separately for each brake.

In an embodiment, the current ratio measured in step 604 defines the air gap of the braking surfaces of the brake. The exceeding 606 of the threshold value th of the current ratio may then define the condition level of the brake and the corresponding air gap.

Different brakes may have different air gaps that define the condition of the brake, that is, whether the brake needs maintenance or has failed and thus has a malfunction. In an embodiment, a threshold value is defined for a current ratio that defines the condition level and corresponding air gap for several brakes. The condition level may be "needs maintenance", for instance, in which case the air gap may be the widest allowed for each brake. The correspondence between the current ratio and air gap of different brakes is shown in FIG. 7c.

Figure 7C:
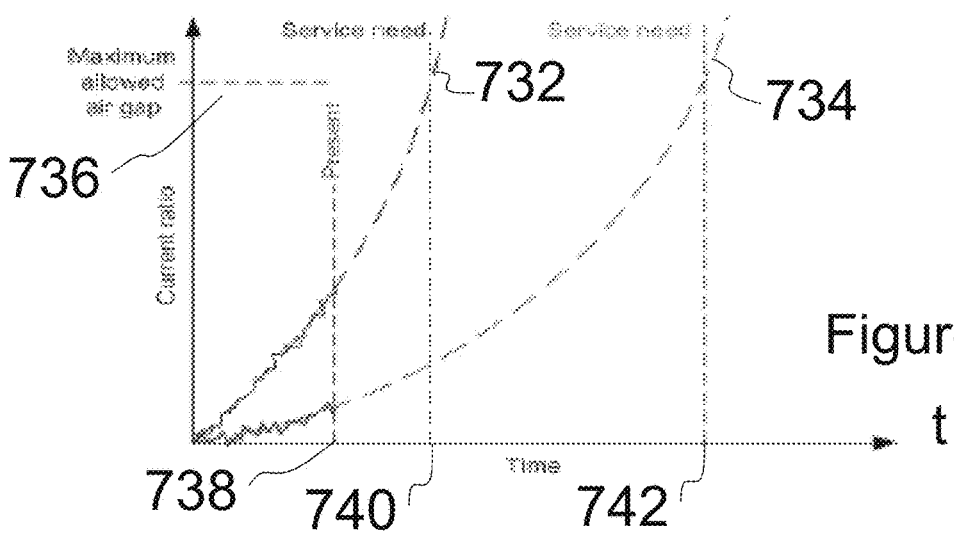
FIG. 7c shows a change in the current ratio of the brake as a function of time as measured from two different brakes in accordance with an embodiment.

FIG. 7c shows the change in the current ratio of the brake as a function of time as measured on two different brakes in accordance with an embodiment. The current ratio of each brake is shown in its own curve 732 and 734. A current ratio has been defined for the brakes to define a threshold value for the brakes. The threshold value represents the air gap, at which the brake needs to be serviced or has failed.

The current ratio curves 732 and 734 of the brakes comprise the measuring values of the current ratios until time instant 738, after which the future current ratios for each brake are estimated. The estimation can be done, for instance, by defining the mathematical function that best corresponds to the measuring results and by applying the defined function to the measuring results. By means of the estimation, maintenance times 740, 742 can be defined for each brake at times when the estimated current ratio curves intersect with the threshold value of the current ratio.

Curve 732 reaches the threshold value 736 of the current ratio at time instant 740, and curve 734 reaches the threshold value 736 of the current ratio at time instant 742. At time instant 740, the brake corresponding to curve 732 has reached an air gap, at which said brake requires maintenance. It is possible to use the same threshold value of the current ratio for both brakes to define the air gap of the braking surfaces of the brake.

The threshold value 736 of the current ratio may define a threshold value that indicates that the brake requires maintenance or has failed.

It should be noted that the estimation of the maintenance time of the brakes is not compulsory. It is also possible to define the current ratio of the brake and determine the condition of the brake in the manner shown in the embodiments described above, when the current ratio measured from the brake reaches the threshold value 736 set for it.

In an embodiment, the service life of the brake is calculated on the basis of one or more current ratios. On the basis of the measurement values of the current ratios, it is possible to estimate 732, 734 future values of the current ratio, in which case the time instant, when the current ratio estimate 732, 734 reaches the threshold value set for the current ratio, is the service life of the brake. For instance with a threshold value of 100%, the entire remaining service life is obtained, after which the brake becomes inoperative. The condition level of the brake is then "defective". The service life can also be calculated to the next maintenance and/or next condition level, for example as the service life of the brake from condition level "in order" to condition level "needs maintenance".

The service life can be defined as a number of decelerations or days until the threshold value of the current ratio is reached. Further, the service life can also be defined for a certain date by calculating the date from the service life as a number of days, for example, and from the current date. The service life of the brake can also be defined as a combination of the number of days, the number of decelerations, and the date, when maintenance requirement for the brake can be detected, and it is also possible to define the time for maintenance, when the estimate of the current ratio exceeds the threshold value in relation to any number of days or decelerations and date.

The current ratio curves 732 of the brakes can be measured from different brakes or from similar brakes, in which the brake corresponding to curve 734 wears more slowly. Slower wear may be due to less use.

Figure 8A:
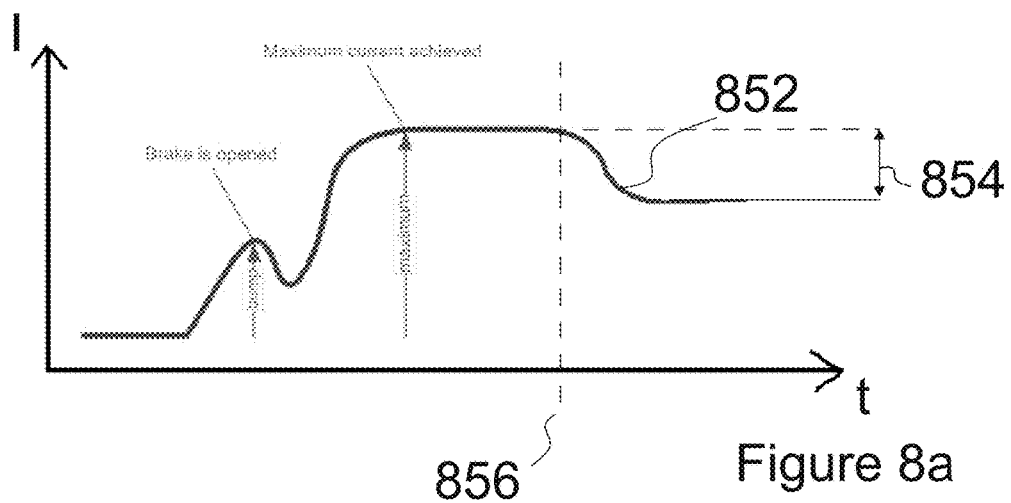
FIG. 8a shows electric current measured with the magnetizing means of an electromagnetic brake, when current is supplied to the magnetizing means from a circuit with a current booster.

FIG. 8a shows the electric current 852 measured with the magnetizing means of an electromagnetic brake, when current is supplied to the magnetizing means from a circuit with a current booster. A current booster can be used to supply electric current to the magnetizing means of the brake in a boosted manner. A current booster is usually used for boosted current supply as soon as the brake is to be released for instance by moving the braking surfaces from the situation in FIG. 2b to the situation in FIG. 2a or closer to the situation shown in FIG. 2a, when the braking surfaces are detached from each other. When an air gap has been formed in the brake, the braking surface 206 in FIG. 2a is closer to the magnetizing means 210 than in the situation shown in FIG. 2b, and the electric current supplied to the brake can be reduced by switching the current booster off. This can be done at the latest, when the brake is fully released. The reduced electric current supplied to the magnetizing means is then enough to keep the brake released.

Curve 852 of FIG. 8a shows a filtered electric current curve. Typically, the curve form of electric current contains an oscillating waveform dependent on the frequency of the mains current. Typically, during the use of a current booster, the frequency of this oscillation is twice the frequency of the mains current, and after the current booster has been switched off, the frequency of the mains current. In brakes with no current booster in use, this waveform typically oscillates all the time at the frequency of the mains current. For the used algorithms, this oscillation needs to the filtered away from the descriptor of the current curve, and typically low-pass filtration is used for this. Filtration has been used in curve 852 of FIG. 8a and in the waveforms of FIGS. 7a and 7b.

Curve 852 of electric current corresponds to curve 702 of FIG. 7a with the exception that the maximum current measured from the magnetizing means of the brake, the electric current measured at time instant $t_{14}$ in FIG. 7a, for instance, decreases after time instant 856 to a lower level 854. The decrease in the electric current is a result of the switching off of the current booster. If there is a disturbance in the current supply, it can possibly be detected from the fact that the electric current does not reach its maximum level, such as the maximum level of current that precedes the current decrease 852 in FIG. 8a. This may be a result of a malfunction in the current supply, for example, in which half-wave rectified current is supplied instead of full-wave rectified current.

If a disturbance occurs, it has a leap effect on the change in current ratio in steps, for example 30% may change into 45%, because the denominator, i.e. maximum current, in the calculation of the current ratio suddenly decreases. A malfunction can be detected in several consecutive decelerations, and the leap-like change can be detected on the basis of the decelerations, when the current ratios of the decelerations are compared with each other. The malfunction can also be detected from one single current curve of deceleration, if a reliable signal is otherwise obtained or information on the use or intention to use a current booster. The malfunction can then be detected in the use of the current booster on the basis of a missing current decrease. Herein, the assumption is that the measuring moment of maximum current is the moment when the current decrease 854 is also visible.

Figure 8B:
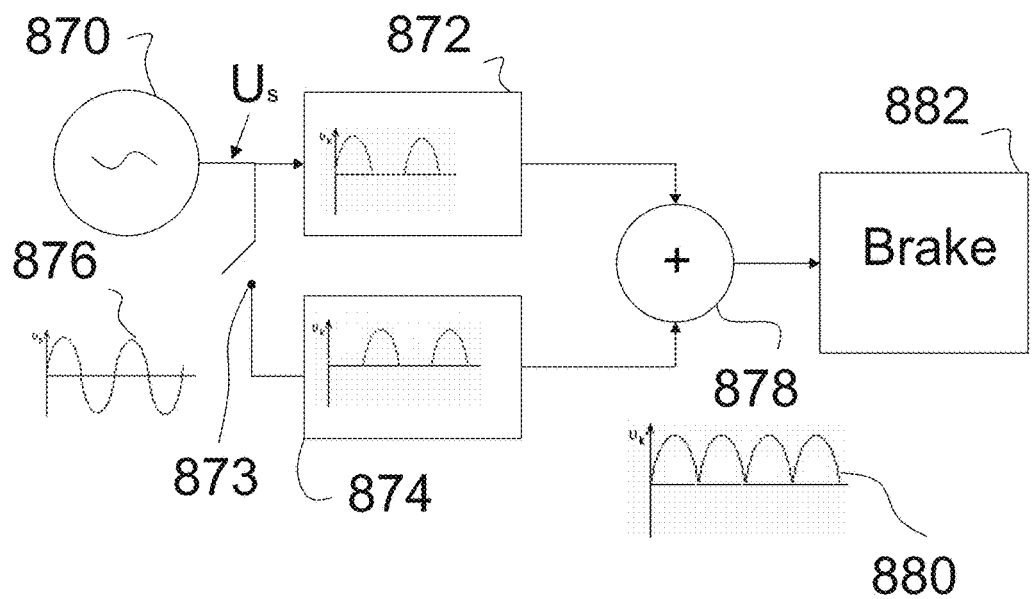
FIG. 8b shows a power supply circuit of an electromagnetic brake with a power booster.

FIG. 8b shows a power supply circuit of an electromagnetic brake 882 with a power booster 874. The power supply circuit is arranged to supply electric current to the brake 882 at different powers. Electric current obtained from a voltage source 870 at low power is supplied to the brake 882 without boosting. When boosting has not been switched on, the voltage source has not been connected to the current booster and the switch 873 is open.

The voltage obtained from the voltage source is typically alternating voltage, as illustrated in item 876. To obtain low power, the alternating voltage obtained from the voltage source is rectified in a rectifier 872. The rectifier 872 may be a half-wave rectifier, for example. Rectified voltage is supplied on to the brake by using the magnetizing means of the brake, in which case the brake can be released along with the movement of the braking surfaces, for instance from the state of FIG. 2b to the state of FIG. 2a. When the switch 873 is open, only voltage from the rectifier 872 is added to the brake 882 through an adder 878.

When the switch 873 is closed, the rectifier 874 acting as the current booster receives voltage from the voltage source. The rectifier 874 then transforms the received voltage into a rectified voltage. Voltage obtained from both rectifiers 872 and 874 is then added to the brake 882 through the adder 878. The current supply of the brake is then boosted. When the switch 873 is closed, the rectifiers may operate together to form a full-wave rectifier for the voltage obtained from the voltage source.

Rectifiers 874 and 872 can be implemented as half-wave rectifiers, for example. When both rectifiers supply electric current to the brake 882, an output voltage in accordance with item 880 is obtained from the adder 878. The maximum current formed in the magnetizing means of the brake is reached as shown in FIG. 8a and curves 702 and 706 of FIG. 7a. When the rectifier is disconnected from the voltage source 870 with the switch 873, the electric current formed in the magnetizing means of the brake drops 852 to a lower level 854.

Usually, a current booster is used when the brake is released to enhance the movement of the brake from the closed state to the open state. When the braking surfaces of the brake have moved to the open or nearly open position, the braking surface is close to the magnetizing means of the brake, like in FIG. 2a, the braking surface 206 is close to the magnetizing means 210. Because the braking surface is closer to the magnetizing means in the open position than in the closed position of the braking surfaces, the braking surfaces can be kept in the open position with a smaller electric current than that required to move them from the closed position to the open position, and the current booster can be switched off.

It should be noted that the power supply circuit of FIG. 8b can also be implemented without a voltage source, in which case instead of the voltage source, the power supply circuit comprises a connection to a power source.

Figure 9:
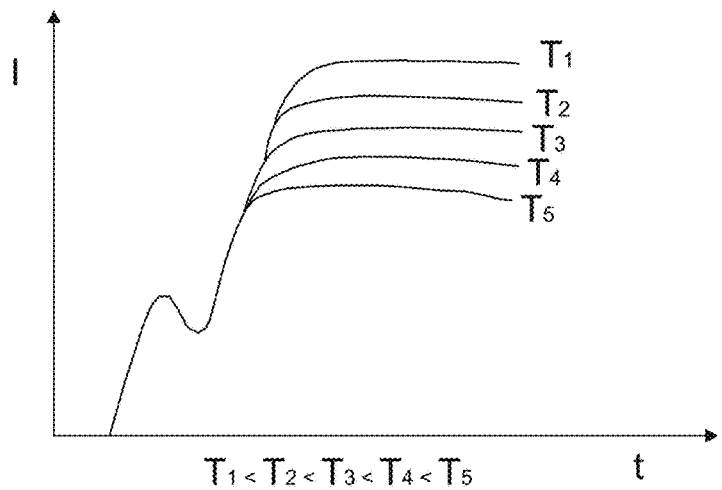
FIG. 9 illustrates a change in the level of the maximum current of the brake on the basis of the temperature.

FIG. 9 illustrates the change in the level of the maximum current in the brake on the basis of the temperature. The effect of the temperature on the current ratio value is seen as a change in the level of the maximum current. In the example of the figure, the brake is taken into use cold, but starts to warm up during use. The figure shows the behaviour of the braking current at different temperatures T. The resistance of a cold brake coil is smaller than that of a warm brake coil, in which case the maximum value of the current is higher with a cold brake than with a warm brake. In the figure, the temperatures increase T1, T2, T3, T4, T5 in ascending order.

Dependence on temperature has thus been detected in the maximum current of the brake, and variation in the supply voltage also affects the maximum current. Increase in the supply voltage increases the maximum current. Both of these may add to the variation in the maximum current. The invention, in turn, works in spite of these phenomena, because the maximum current is included as such in the calculation of the current ratio value. For instance, if the brake is at a high temperature (the situation is becoming more critical in terms of the brake and safety), the maximum power remains lower and the current ratio value becomes higher. Thus, the critical limit for the current ratio value is approached sooner, that is, the situation is safer in terms of the brake and the safety of the hoisting device.

In the manner described above, the temperature of the brake affects the maximum current, and this causes a change in the current ratio value as the temperature changes. Instead, temperature has not been detected to have any significant effect on the level of the release current of the brake. Release current refers to the electric current measured as the braking surfaces start to move from the closed state to the open state. According to an embodiment, the determination and monitoring of the deviation in the release current between consecutive or closely consecutive measurements often gives an indication of the condition of the brake.

Figure 10A:
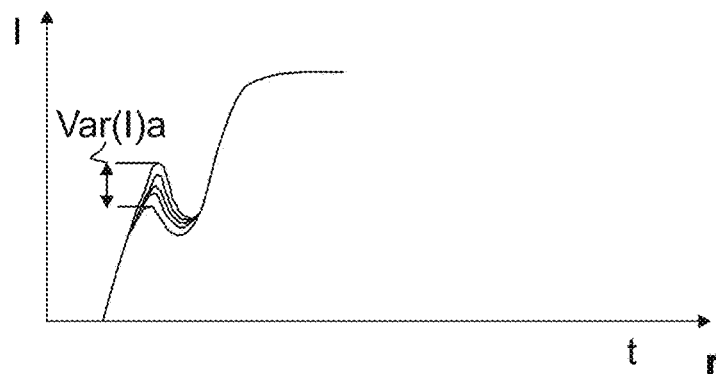
FIG. 10a shows the deviation of release currents of a brake in a normally performing brake.
Figure 10B:
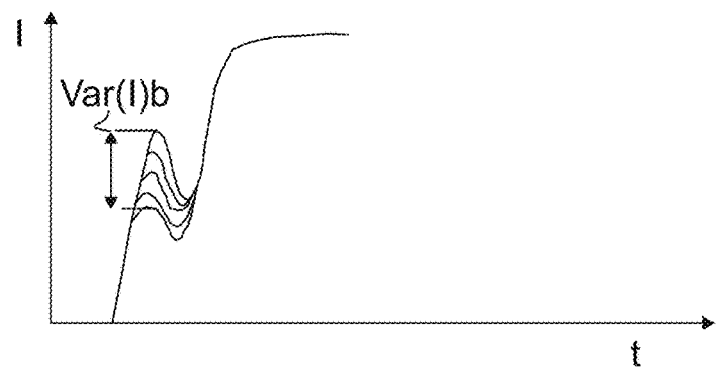
FIG. 10b shows the deviation of release currents of a brake in a malfunctioned brake.

The release current of the brake has a natural deviation that is caused by small changes in the position of the brake disc between different measuring times, for example. This causes a deviation in the release current. The size of the deviation depends on the size of the brake, and the deviation is typically in the range of +/−0.5% of the maximum current, +/−0.25 mA, for instance. A sudden increase in the deviation between decelerations indicates a change in the operation of the brake. FIG. 10a shows the deviation Var(I)a of release currents for a normally performing brake; and FIG. 10b shows the deviation Var(I)b of release currents for a defective brake. It should be noted that the deviations shown in the figures are not in exact scale with respect to each other. In the malfunction situation, the deviation is 8 times bigger than in a normal situation. An increase in the deviation may indicate detachment and breakage of friction material, for instance, which requires immediate maintenance for the brake. Other causes may be a limited movement of the anchor plate of the brake due to a mechanical obstruction, foreign particle, or dust build-up caused by the wear of the brake disc. This unusual operation can be detected and may, in turn, create a notification on a malfunction of the brake.

In an embodiment, the monitoring of the brake comprises measuring a change in the deviation of the brake current, and when the deviation of the release current exceeds a limit in consecutive or closely consecutive measurements, the brake can be defined to be defective. The definition can be done with the monitoring device described above, which may alert or warn through a message transmitted via data transmission means, for example. The alert or warning may also be given through an interface connected to the monitoring device. The limit that causes the alert or warning to be given can be set on the basis of the differences in the deviations of a defective and normally operating brake, as discussed above.

The time sequence of the steps and functions described in FIGS. 5 and 6 is not absolute, and some steps and/or functions may be performed simultaneously or in a different order than described. Other functions may also be performed between the described steps and/or functions, or they may be included in the described steps and/or functions. Some steps and/or functions may also be left out or they may be replaced with a corresponding step and/or function. The functionality of the monitoring device may be implemented in one or more physical or logical units.

The present invention is applicable to any monitoring device, load handling device, hoisting device, crane, bridge crane, harbour crane, straddle carrier, or any combination of different devices having an electromagnetic disc brake, in which the braking surfaces may be in an open or closed state.

In an embodiment, the monitoring device according to the embodiment described above is applied to a hoisting device that is connected to a maintenance centre. The monitoring device can then determine the condition of the brake and send information on it to the maintenance centre. Connection with the maintenance centre can be implemented by the data transmission means 324 of the device according to FIG. 3b, for instance. It should be noted that the information to be sent to the maintenance centre may comprise the condition level of the brake defined in the monitoring device or hoisting device on the basis of the current ratio obtained from the monitoring device. It is also possible that the information sent to the maintenance centre comprises the current ratio defined from the brake, which makes it possible to determine the brake's condition level. This way, the determination of the condition level need not be done in the monitoring device and the implementation of the monitoring device is simpler. Further, when the condition level is determined in the maintenance centre that receives information from several hoisting devices, the current ratio values from different hoisting devices and brakes can be compared and the condition level determined more precisely.

Devices, such as monitoring devices, load handling devices, hoisting devices, cranes, bridge cranes, harbour cranes, straddle carriers, which implement the functionality of the device according to the embodiments described above, comprise not only the prior-art means, but also means for defining the maximum electric current of the magnetizing means of the brake in the open state and for defining the condition of the brake as a current ratio from the electric current measured as the braking surfaces start to move to the maximum electric current. More specifically, they may comprise means for implementing the functionality of the device described in the embodiment described above, and they may comprise separate means for each separate function, or the means may be arranged to perform two or more functions. Known devices comprise processors and memory that may be utilized for the one or more functionalities described in the embodiments described above. For instance, the monitoring device may comprise an application program or a module or a unit capable of an arithmetic function, or a program (including an added or updated software routine) that may be executed by a processor, for example. Software, which may also be called software products, including program routines, applets and macros, may be stored on any data storage medium readable by the device, and they contain program instructions for executing specific tasks. All changes and arrangements that are needed to implement the functionality of the present embodiment may be executed by routines that may be implemented either as added or updated software routines, application-specific circuits (ASIC) and/or programmable circuits. In addition, software routines may be downloaded into a device according to the described embodiment. The device, such as a monitoring device, may be implemented by a computer or as a microprocessor, such as a one-chip computer element, that contains at least memory to provide a storage area for use in arithmetic operations and a processor for performing arithmetic operations. An example of a processor is a central processing unit (CPU). The memory may be detachably attached to the device.

In an embodiment, the brake monitoring device that implements one or more embodiments described above, is in remote connection with the maintenance centre. In this way, the condition of the brakes can be sent to the maintenance centre, where a maintenance plan can be created for the brake and implemented by defining a maintenance time, for instance. Further, the maintenance plan of the brakes can be included in the maintenance plan of the device containing the brakes, such as that of a harbour crane. In this way, both maintenance plans, their maintenance cycles and times, for instance, can be scheduled so that the harbour crane can be kept in operation, thus keeping its off-production time short.

It will be apparent to a person skilled in the art that as technology advances, the basic idea of the invention may be implemented in many different ways. The invention and its embodiments are thus not restricted to the examples described above but may vary within the scope of the claims.

The invention claimed is:

1. A method for monitoring a brake that comprises:
first and second braking surfaces, and
magnetizing means which, in response to an electric current supplied to the magnetizing means, are configured to generate a magnetic field that moves the braking surfaces from a closed state, in which the braking surfaces are connected to each other, to an open state, in which the braking surfaces are separated from each other; the method comprising:
generating the magnetic field by the magnetizing means to move the braking surfaces from the closed state, in which the braking surfaces are connected to each other, to the open state, in which the braking surfaces are separated from each other;
determining the electric current of the magnetizing means as the braking surfaces begin to move from the closed state to the open state,
determining a maximum electric current of the magnetizing means of the brake in the open state;
determining a condition of the brake as a current ratio from the electric current measured as the braking surfaces start to move to said maximum electric current.

2. The method as claimed in claim 1, wherein, for a calculation of the current ratio, the maximum electric current of the magnetizing means is determined at a time instant of a local minimum of a time derivative of the brake current or at a time preceding the local minimum.

3. The method as claimed in claim 1, wherein an adequacy of the electric current supplied to the brake is determined on the basis of said current ratio.

4. The method as claimed in claim 1, wherein an air gap between the braking surfaces is determined on the basis of said current ratio.

5. The method as claimed in claim 1, wherein the current ratio is determined once or several times; and
the condition of the brake is determined on the basis of one or more determined current ratios.

6. The method as claimed in claim 1, wherein a disturbance in the power supply of the brake is determined on the basis of the change in the current ratios determined from several consecutive brake releases.

7. The method as claimed in claim 1, wherein the condition of the brake is determined, when the current ratio of the brake exceeds a threshold value set for the current ratio.

8. The method as claimed in claim 1, wherein the condition of the brake is determined on the basis of said current ratio and a current ratio threshold value defined for several brakes that differ in their electric and/or magnetic properties.

9. The method as claimed in claim 1, wherein several brakes are monitored by using a same current ratio threshold value.

10. The method as claimed in claim 1, wherein a service life of the brake is calculated on the basis of one or more current ratios, and the service life comprises a number of decelerations, date, number of days or combination thereof.

11. The method as claimed in claim 1, wherein a service life of the brake is calculated on the basis of one or more current ratios and the service life is displayed on a display.

12. The method as claimed in claim 1, wherein a warning or alert is given, when an increase in the deviation of the electric current measured as the braking surfaces start to move from the closed state to the open state in consecutive or closely consecutive measurings exceeds a given limit.

13. A device for monitoring an electromagnetic brake comprising first and second braking surfaces and magnetizing means which, in response to an electric current supplied to the magnetizing means, are configured to generate a magnetic field that moves the braking surfaces from a closed state, in which the braking surfaces are connected to each other, to an open state, in which the braking surfaces are separated from each other, the device being configured to:
determine the electric current of the magnetizing means as the braking surfaces begin to move from the closed state to the open state, wherein the device is configured to
determine a maximum electric current of the magnetizing means of the brake in the open state;
determine a condition of the brake as a current ratio from the electric current measured as the braking surfaces start to move to the maximum electric current.

14. The device as claimed in claim 13, wherein, for a calculation of the current ratio, the maximum electric current of the magnetizing means is determined at a time instant of a local minimum of a time derivative of the brake current or at a time preceding the local minimum.

15. The device as claimed in claim 13, wherein the device is configured to determine an adequacy of the current supplied to the brake on the basis of said current ratio.

16. The device as claimed in claim 13, wherein the device is configured to determine an air gap between the braking surfaces on the basis of said current ratio.

17. The device as claimed in claim 13, wherein the device is configured to determine a current ratio that is measured once or several times; and
to determine the condition of the brake on the basis of the one or more determined current ratios.

18. The device as claimed in claim 13, wherein the device is configured to determine a disturbance in the power supply of the brake on the basis of a change in current ratios determined from several consecutive brake releases.

19. The device as claimed in claim 13, wherein the device is configured to determine the condition of the brake, when the current ratio of the brake exceeds a threshold value set for the current ratio.

20. The device as claimed in claim 13, wherein the device is configured to determine the condition of the brake on the basis of said current ratio and a threshold value determined for several brakes that differ in their electric and/or magnetic properties.

21. The device as claimed in claim 13, wherein the device is configured to monitor several brakes by using a same threshold value of the current ratio.

22. The device as claimed in claim 13, wherein a service life of the brake is calculated on the basis of one or more current ratios, and the service life comprises a number of decelerations, date, number of dates, or combination thereof.

23. The device as claimed in claim 13, wherein a service life of the brake is calculated on the basis of one or more current ratios, and the service life is displayed on a display.

24. The device as claimed in claim 13, wherein the device is configured to give a warning or alert, when an increase in the deviation in the electric current measured as the braking surfaces start to move from the closed state to the open state in consecutive measurings or in immediately consecutive measurings exceeds a given limit.

25. A computer program product comprising a non-transitory computer-readable storage medium having program instructions that when downloaded into a device cause the device to execute a method for monitoring a brake that comprises:
first and second braking surfaces, and
magnetizing means which, in response to an electric current supplied to the magnetizing means, are configured to generate a magnetic field that moves the braking surfaces from a closed state, in which the braking surfaces are connected to each other, to an open state, in which the braking surfaces are separated from each other;
the method comprising:
determining the electric current of the brake as the braking surfaces begin to move from the closed state to the open state;
determining a maximum electric current of the magnetizing means of the brake in the open state;
determining a condition of the brake as a current ratio from the electric current measured as the braking surfaces start to move to said maximum electric current.

26. A device comprising means for carrying out a method for monitoring a brake that comprises:
first and second braking surfaces, and
magnetizing means which, in response to an electric current supplied to the magnetizing means, are configured to generate a magnetic field that moves the braking surfaces from a closed state, in which the braking surfaces are connected to each other, to an open state, in which the braking surfaces are separated from each other;
the method comprising:
determining the electric current of the magnetizing means as the braking surfaces begin to move from the closed state to the open state;
determining a maximum electric current of the magnetizing means of the brake in the open state;
determining a condition of the brake as a current ratio from the electric current measured as the braking surfaces start to move to said maximum electric current.

27. An arrangement comprising a device for monitoring an electromagnetic brake comprising first and second braking surfaces and magnetizing means which, in response to an electric current supplied to the magnetizing means, are configured to generate a magnetic field that moves the braking surfaces from a closed state, in which the braking surfaces are connected to each other, to an open state, in which the braking surfaces are separated from each other, the device being configured to:
determine the electric current of the magnetizing means as the braking surfaces begin to move from the closed state to the open state, wherein the device is configured to
determine a maximum electric current of the magnetizing means of the brake in the open state;
determine a condition of the brake as a current ratio from the electric current measured as the braking surfaces start to move to the maximum electric current.

28. The arrangement as claimed in claim 27, wherein the arrangement comprises one or more electromagnetic brakes or hoisting devices, or a combination thereof.

29. An arrangement comprising a device comprising means for carrying out a method
for monitoring a brake that comprises:
first and second braking surfaces, and
magnetizing means which, in response to an electric current supplied to the magnetizing means, are configured to generate a magnetic field that moves the braking surfaces from a closed state, in which the braking surfaces are connected to each other, to an open state, in which the braking surfaces are separated from each other;
the method comprising:
determining the electric current of the magnetizing means as the braking surfaces begin to move from the closed state to the open state;
determining a maximum electric current of the magnetizing means of the brake in the open state;
determining a condition of the brake as a current ratio from the electric current measured as the braking surfaces start to move to said maximum electric current.

30. The arrangement as claimed in claim 29, wherein the arrangement comprises one or more electromagnetic brakes or hoisting devices, or a combination thereof.

31. A method for upgrading a hoisting device with a monitoring function, wherein the hoisting device comprises an electromagnetic brake comprising first and second braking surfaces and magnetizing means which, in response to an electric current supplied to the magnetizing means, are configured to generate a magnetic field that moves the braking surfaces from a closed state, in which the braking surfaces are connected to each other, to an open state, in which the braking surfaces are separated from each other, the method comprising:
installing, in connection with an electromagnetic brake, a computer program product that comprises program instructions configured to cause the hoisting device to:
determine the electric current of the magnetizing means as the braking surfaces begin to move from the closed state to the open state;
determine a maximum electric current of the magnetizing means of the brake in the open state;
determine a condition of the brake as a current ratio from the electric current measured as the braking surfaces start to move to said maximum electric current.

32. A method for upgrading a hoisting device with a monitoring function, wherein the hoisting device comprises an electromagnetic brake comprising first and second braking surfaces and magnetizing means which, in response to an electric current supplied to the magnetizing means, are configured to generate a magnetic field that moves the braking surfaces from a closed state, in which the braking surfaces are connected to each other, to an open state, in which the braking surfaces are separated from each other, the method comprising:
installing, in connection with an electromagnetic brake, a device comprising means for:
determining the electric current of the magnetizing means as the braking surfaces begin to move from the closed state to the open state;
determining a maximum electric current of the magnetizing means of the brake in the open state;
determining a condition of the brake as a current ratio from the electric current measured as the braking surfaces start to move to said maximum electric current.

33. A method for upgrading a hoisting device with a monitoring function, wherein the hoisting device comprises an electromagnetic brake comprising first and second braking surfaces and magnetizing means which, in response to an electric current supplied to the magnetizing means, are configured to generate a magnetic field that moves the braking surfaces from a closed state, in which the braking surfaces are connected to each other, to an open state, in which the braking surfaces are separated from each other, the method comprising:
installing, in connection with an electromagnetic brake, a device being configured to:
determine the electric current of the magnetizing means as the braking surfaces begin to move from the closed state to the open state, wherein the device is configured to
determine a maximum electric current of the magnetizing means of the brake in the open state;
determine a condition of the brake as a current ratio from the electric current measured as the braking surfaces start to move to the maximum electric current.

* * * * *